(12) United States Patent
Lin

(10) Patent No.: US 9,331,214 B2
(45) Date of Patent: May 3, 2016

(54) DIODE CELL MODULES

(71) Applicant: Joe Lin, Gardena, CA (US)

(72) Inventor: Joe Lin, Gardena, CA (US)

( * ) Notice: Subject to any disclaimer, the term of this patent is extended or adjusted under 35 U.S.C. 154(b) by 171 days.

(21) Appl. No.: 13/623,390

(22) Filed: Sep. 20, 2012

(65) Prior Publication Data

US 2013/0087899 A1 Apr. 11, 2013

Related U.S. Application Data

(60) Provisional application No. 61/627,363, filed on Oct. 11, 2011.

(51) Int. Cl.
| | |
|---|---|
| *H01L 31/048* | (2014.01) |
| *H01L 31/02* | (2006.01) |
| *H01L 23/495* | (2006.01) |
| *H01L 31/042* | (2014.01) |
| *H01L 21/02* | (2006.01) |

(52) U.S. Cl.
CPC .... *H01L 31/02021* (2013.01); *H01L 23/49551* (2013.01); *H01L 23/49562* (2013.01); *H01L 23/49575* (2013.01); *H01L 21/02008* (2013.01); *H01L 31/0201* (2013.01); *H01L 31/02013* (2013.01); *H01L 31/0422* (2013.01); *H01L 2924/0002* (2013.01); *Y02E 10/50* (2013.01)

(58) Field of Classification Search
CPC ....................................................... H01L 23/48
USPC ................. 257/676, 687, 688, 689, 712, 787, 257/E33.066
See application file for complete search history.

(56) References Cited

U.S. PATENT DOCUMENTS

| | | | | |
|---|---|---|---|---|
| 5,757,020 A | * | 5/1998 | Torazawa et al. | 250/551 |
| 2005/0133086 A1 | | 6/2005 | Itoyama et al. | |
| 2006/0289971 A1 | * | 12/2006 | Lange et al. | 257/666 |

FOREIGN PATENT DOCUMENTS

| | | |
|---|---|---|
| CN | 201327835 | 10/2009 |
| RU | 2008749 | 2/1994 |
| RU | 2360325 | 10/2008 |

* cited by examiner

*Primary Examiner* — William Harriston
(74) *Attorney, Agent, or Firm* — Mohr Intellectual Property Law Solutions, PC

(57) ABSTRACT

Diode cell modules for use within photovoltaic systems, including lead frames including first leads extending from the first outlet terminal, second leads spaced from the first leads, second outlet terminals extending from the second leads, and diodes. In some examples, first leads define base portions connected to the first outlet terminal and diode portions extending from the base portions transverse to the first outlet terminal. In some examples, second leads may define a base portion and diode portions extending from the base portion substantially parallel to the diode portion of the first lead. In some examples, diodes may be in electrical contact with the diode portion of the first lead and with the diode portion of the second lead. In some examples, the first leads and second leads may be thermally conductive. In some examples, diodes may define die interfaces that are substantially fully engaged with diode portions of leads.

20 Claims, 9 Drawing Sheets

DIODE CELL MODULES

CROSS REFERENCE TO RELATED APPLICATIONS

This application claims priority to U.S. Provisional Application, Ser. No. 61/627,363, filed on Oct. 11, 2011, which is hereby incorporated by reference for all purposes.

BACKGROUND

The present disclosure relates generally to bypass diode cells. In particular, bypass diode cells configured to form bypass diode cell modules that may be used to direct electric current away from shaded portions of photovoltaic panels to inhibit or prevent the panels from malfunctioning. In addition, fully integrated bypass diode cell modules with improved heat dissipating characteristics are described.

Many known bypass circuits used in photovoltaic systems are unsatisfactory. For example, many existing circuits include Schottky diodes that are ill-suited for handling the level of current and heat to which they are often exposed when the bypass circuit is engaged due to photovoltaic solar module panel shading during normal operation. Many conventional Schottky diodes include axial-leaded or jumper-wire based packages that include thin wires connected, often by solder, to one or both of the diodes' terminals. The solder junctions where these wires are connected to diodes' dies may define "solder voids" formed when connecting the wires. These solder voids may impede heat dissipation from diode's die when a current is applied to a corresponding die.

Further, because the tips of wires used are small, they are soldered to only a relatively small area of the diodes' dies to form little direct contact. This is an inadequate design to support the levels of current typically passing through bypass diodes during operation. Further, this minimal contact reduces the wires' ability to direct heat away from the dies.

These and other shortcomings of conventional bypass diode circuit designs cause bypass diodes to generate and trap excessive heat during operation. In many conventional bypass circuits, this can lead to catastrophic equipment failure. Equipment failure may lead to expensive maintenance, repairs, parts replacement, and downtime.

Despite conventional bypass diodes' insufficient thermal regulation measures, most bypass circuits (or junction boxes housing them) do very little to promote heat dissipation away from bypass diodes or the bypass circuit. Many conventional bypass circuits include diodes that are electrically connected to photovoltaic panels in a plastic junction box that protects against environmental damage, but the plastic housing also denies the bypass circuit effective means to dissipate heat and thus traps heat inside the bypass circuit. The combination of deficiencies in bypass diode structure and bypass circuit design force bypass diodes to operate at unacceptably high temperature levels, which either reduces their reliability or results in catastrophic failure.

Indeed, in many conventional bypass circuits, diodes are simply positioned within an enclosed space within a junction box. Often no additional measures are taken to regulate their operating temperature, either with the junction box or the physical design of the circuit. Accordingly, many conventional bypass circuits fail to include appropriate physical structures that regulate heat and avoid malfunctions.

Thus, there exists a need for diode circuits, and modules including the same, that improve upon and advance the design of known diode circuits. Examples of new and useful diode cell modules relevant to the needs existing in the field are discussed below.

Disclosure addressing one or more of the identified existing needs is provided in the detailed description below. An example of a reference relevant to photovoltaic bypass systems include U.S. Patent References U.S. Pat. No. 7,291,036. The complete disclosure of the above patent is herein incorporated by reference for all purposes.

SUMMARY

The present disclosure is directed to Diode cell modules for use within photovoltaic systems, including lead frames including first leads extending from the first outlet terminal, second leads spaced from the first leads, second outlet terminals extending from the second leads, and diodes. In some examples, first leads define base portions connected to the first outlet terminal and diode portions extending from the base portions transverse to the first outlet terminal. In some examples, second leads may define a base portion and diode portions extending from the base portion substantially parallel to the diode portion of the first lead. In some examples, diodes may be in electrical contact with the diode portion of the first lead and with the diode portion of the second lead. In some examples, the first leads and second leads may be thermally conductive. In some examples, diodes may define die interfaces that are substantially fully engaged with diode portions of leads.

DETAILED DESCRIPTION

The disclosed diode cell modules will become better understood through review of the following detailed description in conjunction with the figures. The detailed description and figures provide merely examples of the various inventions described herein. Those skilled in the art will understand that the disclosed examples may be varied, modified, and altered without departing from the scope of the inventions described herein. Many variations are contemplated for different applications and design considerations; however, for the sake of brevity, each and every contemplated variation is not individually described in the following detailed description.

Throughout the following detailed description, examples of various diode cell modules are provided. Related features in the examples may be identical, similar, or dissimilar in different examples. For the sake of brevity, related features will not be redundantly explained in each example. Instead, the use of related feature names will cue the reader that the feature with a related feature name may be similar to the related feature in an example explained previously. Features specific to a given example will be described in that particular example. The reader should understand that a given feature need not be the same or similar to the specific portrayal of a related feature in any given figure or example.

Figure 1:
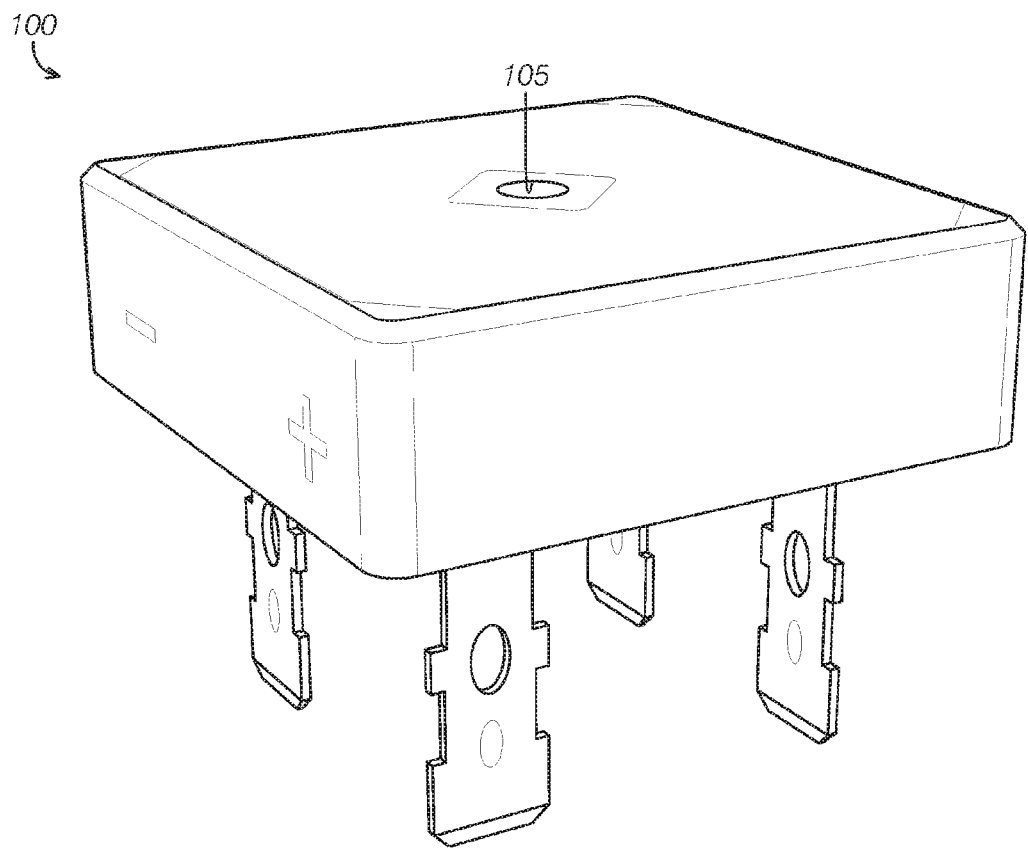
FIG. 1 is a perspective view of a first example of a diode cell module.
Figure 2:
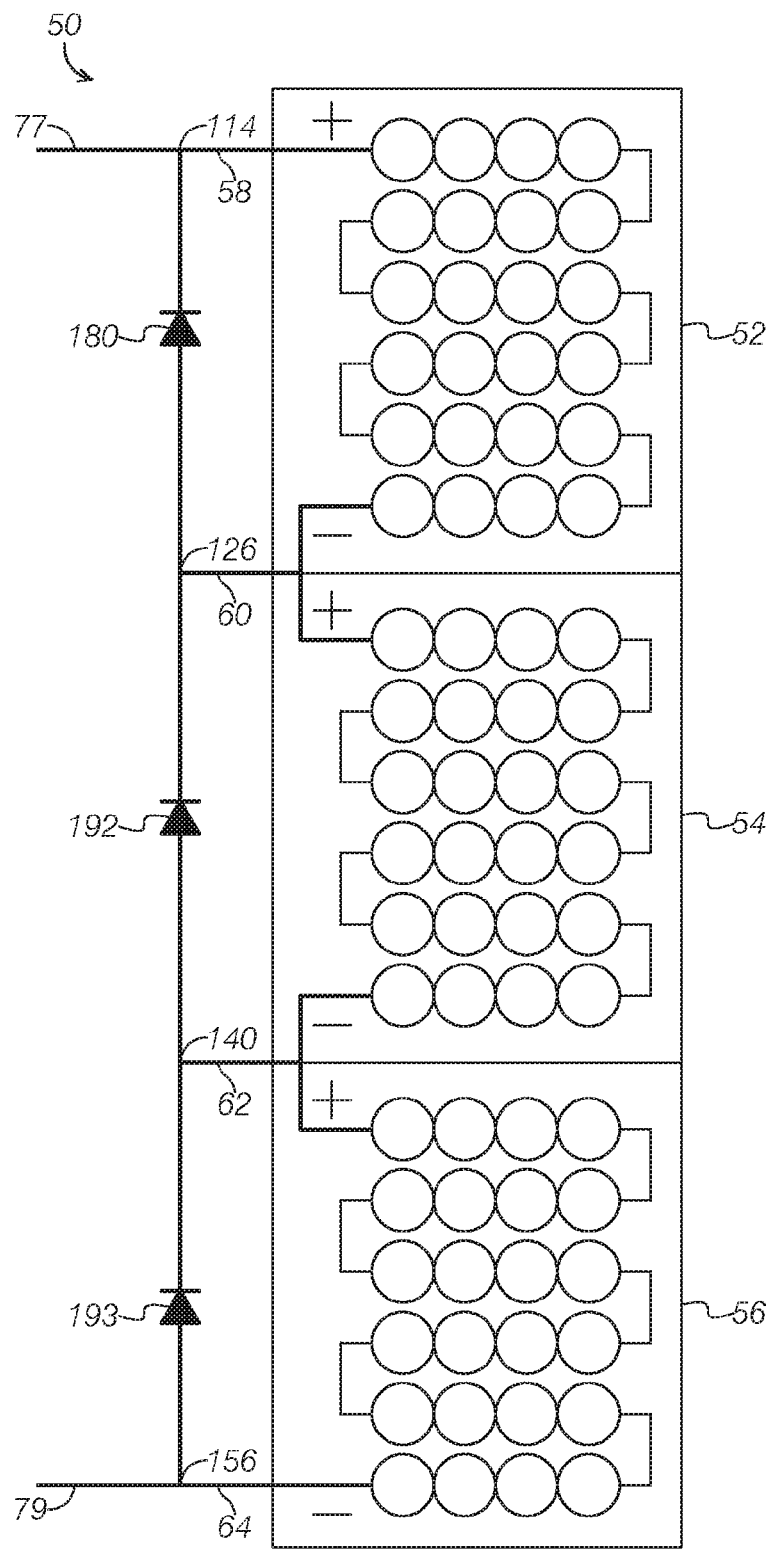
FIG. 2 is a schematic view of a circuit including the diode cell module shown in FIG. 1 electrically connected to a photovoltaic panel.
Figure 3:
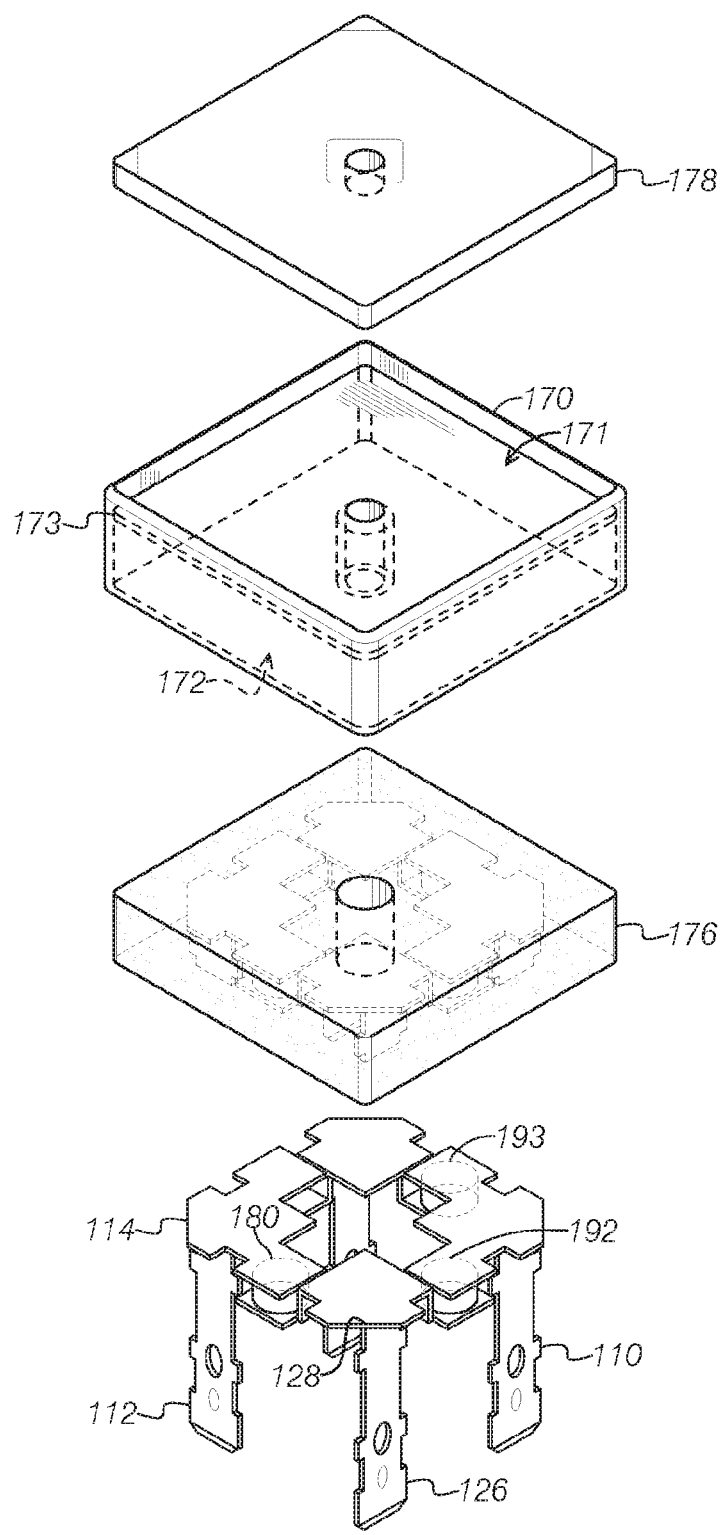
FIG. 3 is an exploded view of the diode cell module shown in FIG. 1.

With reference to FIGS. 1-9, a first example of a diode cell module, module 100, will now be described. As FIG. 3 shows, module 100 includes a lead frame 110, a first diode 180, a second diode 192, a third diode 193, a encapsulation case 170, an encapsulant 176, and a thermal dissipating member 178. Module 100 includes a circuit including plurality of diodes electrically connected through electrically conductive lead frame 110.

Module 100 may be useful, for example, in photovoltaic panel bypass circuits. As FIG. 3 illustrates, module 100 includes a compact design and includes features that allow module 100 to dissipate heat more effectively than many existing bypass circuits. For example, module 100 draws heat away from the diodes by directing heat away from the diode with one or more thermally conducting features.

Module 100 may be used as a bypass circuit connected to a photovoltaic system. For example, module 100 may be connected to photovoltaic panel 50 to serve as a bypass circuit, as shown schematically in FIG. 2. As FIG. 2 illustrates, panel 50 includes three strings of photovoltaic cells, first string 52, second string 54, and third string 56. As FIG. 2 shows, each string includes a positive terminal and a negative terminal and is configured to generate current directed from the negative terminal toward the positive terminal when exposed to light. The three strings are connected in series; for example, the negative terminal of first string 52 is connected to the positive terminal of second string 54 and the negative terminal of second string 54 is connected to the positive terminal of third string 56. When exposed to light, the series of strings typically generate current that flows from third string 56's negative terminal toward first string 52's positive terminal.

Figure 6:
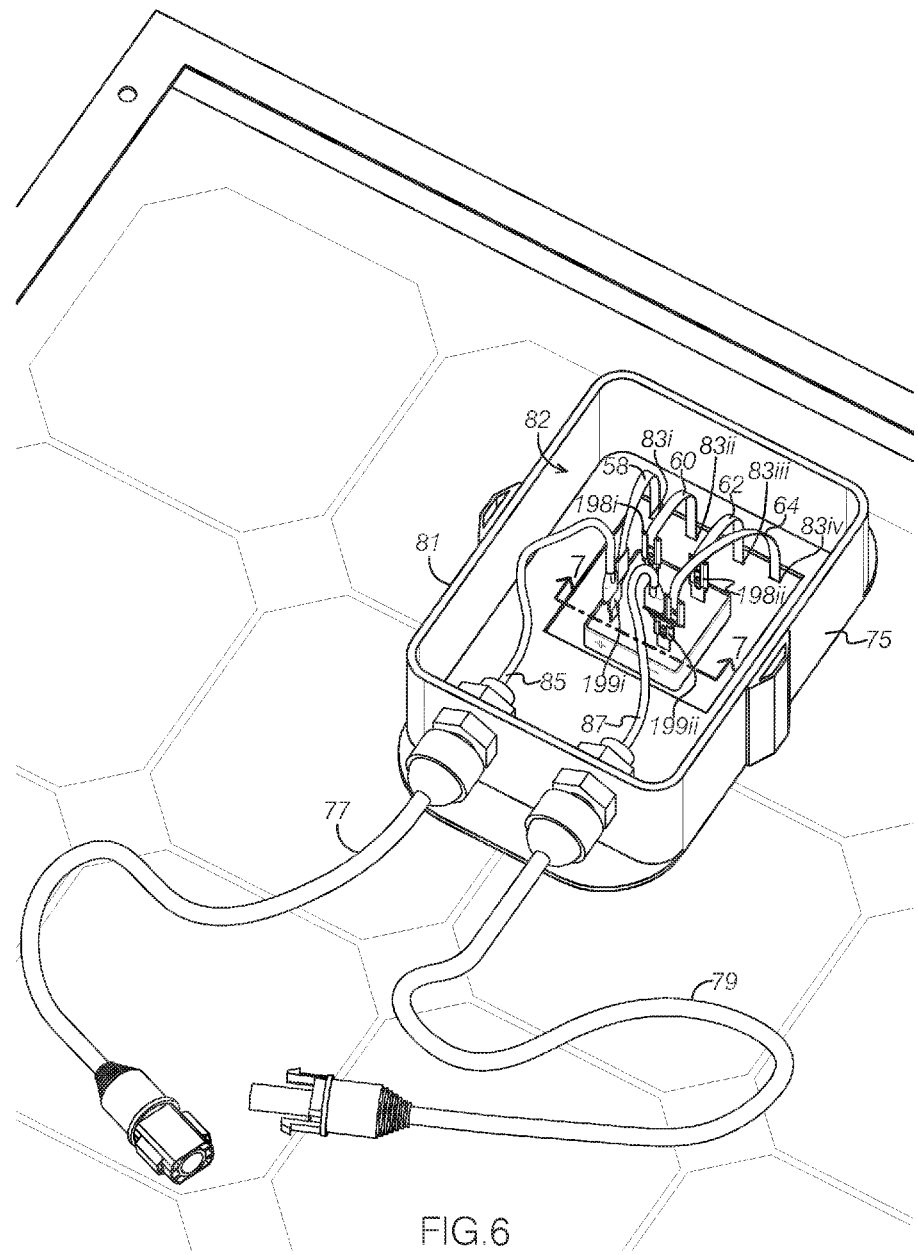
FIG. 6 is a perspective view of the junction box shown in FIG. 5 in an open configuration.

As FIG. 2 shows, panel leads extend from the ends of each of the panels. For example, a first panel lead 58 extends from the positive terminal of first string 52, a second panel lead 60 extends from the connection between first string 52 and second string 54, a third panel lead 62 extends from the connection between second string 54 and third string 56, and a fourth panel lead 64 extends from the negative terminal of third string 56. FIG. 6 shows an example physical implementation of these leads, wherein the leads extend through the rear of panel 50. As FIG. 6 shows, the panel leads may allow module 100 to connect to panel 50's circuitry.

When exposed to light, each photovoltaic cell acts primarily as a current source directed toward the associated positive terminal, as illustrated in FIG. 2. When shaded, however, each photovoltaic cell may act as an open circuit in parallel with a reverse-biased diode. This may produce a backflow current that can cause malfunction or damage to previous cells or strings.

The leads allow bypass diodes to be connected on the exterior of the panels. Bypass diodes may allow backflow current to bypass one or more of the panel strings and route it toward an output (which is, in this case, electrically connected with fourth panel lead 64). In typical cases, module 100 is connected to panel 50 with first diode 180, second diode 192, and third diode 193 each connected in parallel with a corresponding string of photovoltaic cells. Each diode provides a bypass route for backflow current resulting from shaded cells, which may prevent additional cells from malfunctioning or damage.

Figure 5:
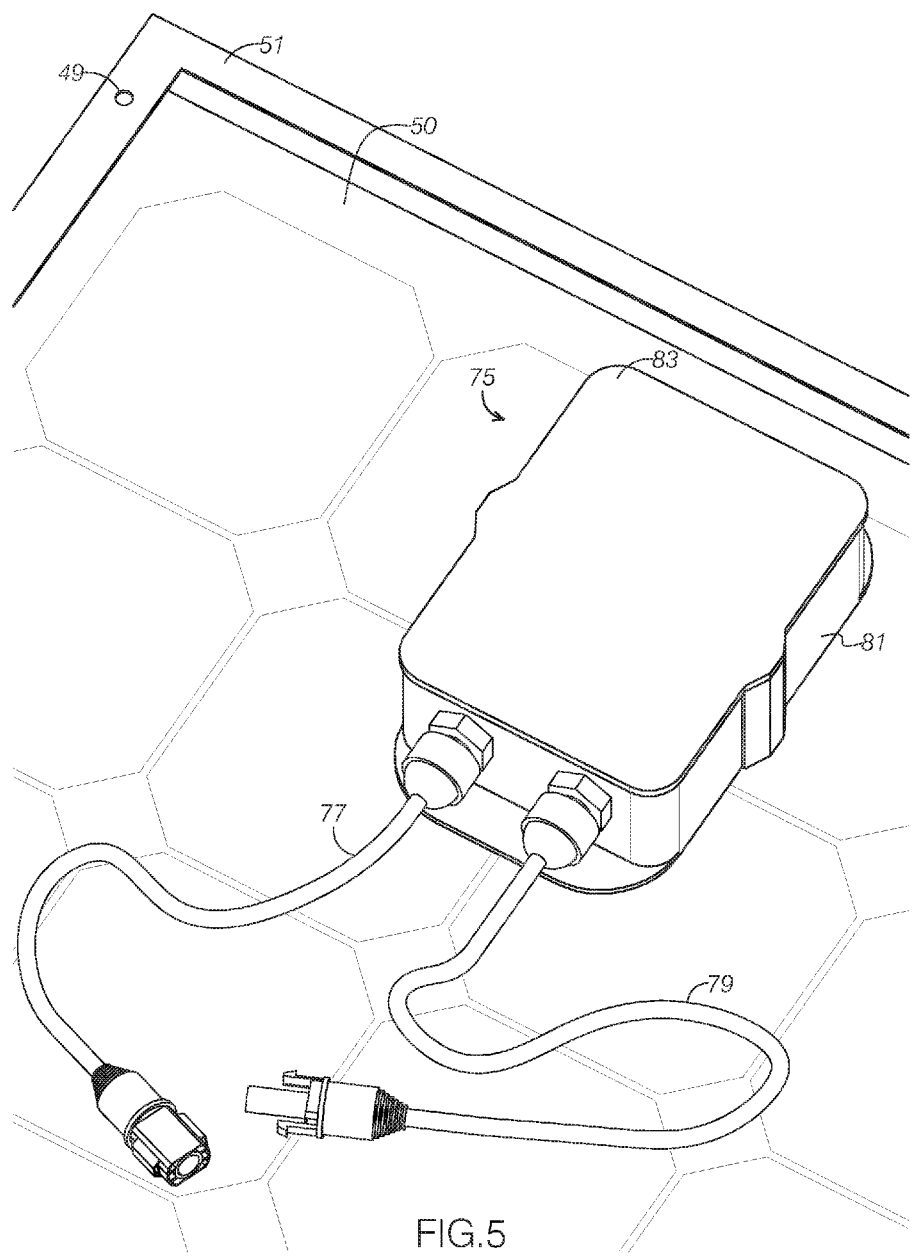
FIG. 5 is a perspective view of a junction box housing the diode cell module shown in FIG. 1 supported on a photovoltaic panel.

In some cases, module 100 may be connected to panel 50 by fitting it within in junction box 75 and connecting junction box 75 to panel 50. As FIG. 5 shows, junction box 75 includes a first system cable 77, a second system cable 79, a junction box enclosure 81, and a junction box cap 83. As FIG. 6 illustrates, junction box 75 additionally includes a first external cable lead 85, a second external cable lead 87, and four panel lead openings, panel lead opening 83*i*, panel lead opening 83*ii*, panel lead opening 83*iii*, and panel lead opening 83*iv*. In some cases, junction boxes may include a single open space on the side facing the panel, through which all of the panel leads are routed.

Junction box 75 encloses an environmentally protected enclosed space 82, within which module 100 may electronically interface with panel 50 with a reduced risk of environmental harm, such as from precipitation. As FIG. 5 illustrates, junction box 75 may be attached to the rear of panel 50 (opposite the exposed photovoltaic cells) near the panel's leads. In some examples, junction box 75 may be attached by applying an environmentally tight adhesive to its perimeter and adhering junction box 75 to the rear of a photovoltaic panel. Junction box cap 83 may be removably affixed above enclosed space 82 to similarly seal the side of enclosed space 82 opposite panel 50 while leaving it accessible for maintenance.

First system cable 77 and second system cable 79 may be connected to external electronic systems. They may be used, for example, to output current generated by panel 50 to external loads and power systems, such as the panel owner's own use or external power systems. As FIG. 6 illustrates, first external cable lead 85 and second external cable lead 87 may be used to connect first system cable 77 and second system cable 79 to module 100's circuitry within enclosed space 82. In some examples, first system cable 77 may direct current generated by panel 50 toward external loads.

In some examples, junction box enclosure 81 and junction box cap 83 may include thermally conductive material, such as metals, to dissipate of heat out of enclosed space 82. In some examples, junction box 75 may additionally or alternatively be joined to panel 50 using a thermally conductive adhesive, which allow junction box 75 to dissipate heat through panel 50's metal structures.

As FIG. 6 shows, each of the panel lead openings, panel lead opening 83*i*, panel lead opening 83*ii*, panel lead opening 83*iii*, and panel lead opening 83*iv*, are each configured to receive a corresponding panel lead, which may then be connected to module 100 within enclosed space 82.

As FIG. 3 illustrates, module 100 includes three bypass diodes, first diode 180, second diode 192, and third diode 193, supported by lead frame 110. As FIG. 2 illustrates, each bypass diode may be connected, in parallel, to a photovoltaic string to provide a path for backflow current to bypass shaded cells and thereby reduce the likelihood of the corresponding panel malfunctioning or being damaged.

As FIG. 3 shows, first diode 180 includes several features may increase its efficacy in directing current and dissipating generated heat away from diodes' dies. First diode 180 defines a Schottky diode including features supporting its heat transfer abilities.

Figure 4:
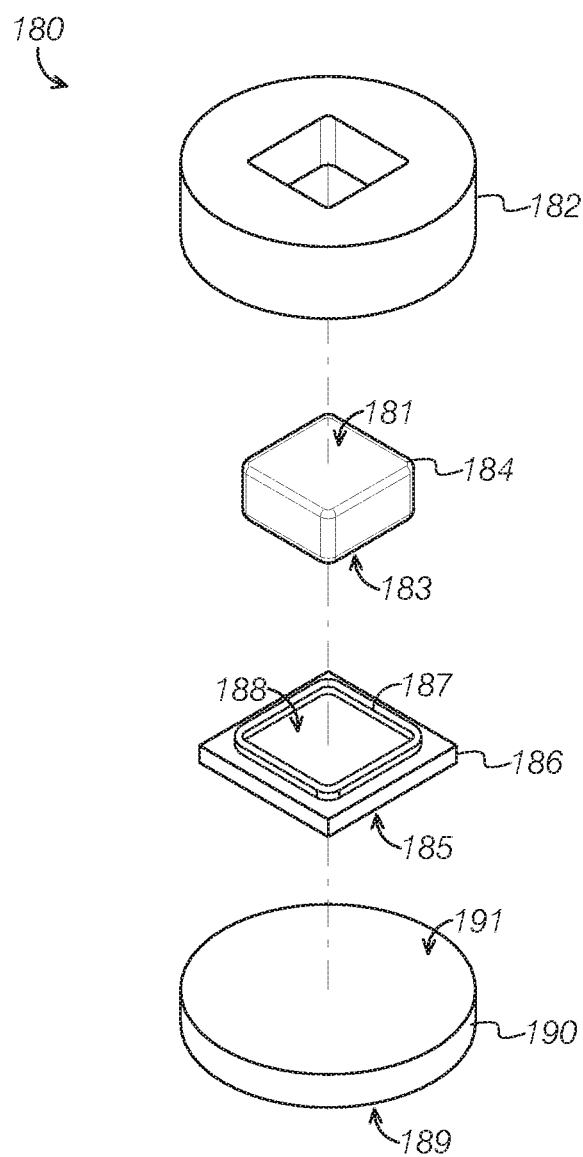
FIG. 4 is an exploded view of a diode included in the diode cell module shown in FIG. 1.

As FIG. 4 illustrates, first diode 180 includes a bottom die interface 190, a die 186, a top die interface 184, and a silicone layer 182. First diode 180 includes several features that provide improved current flow and heat transfer compared to many traditional diode designs. For example, first diode 180 provides, through bottom die interface 190 and top die interface 184, a greater amount of conductive surface area available to connect first diode 180 to external circuitry. This allows first diode 180 to be connected over a larger surface area than the wires of many traditional diodes, thereby allowing greater current capacity and better thermal conduction away from die 186.

Bottom die interface 190, as depicted in FIG. 4, defines an electrically conductive, silver-plated copper slug in electrical communication with die 186. Bottom die interface 190's defines a bottom surface area 189, which is substantially planar to allow bottom surface area 189 to electrically communicate across substantially all of its surface area, allowing bottom die interface 190 to electrically and thermally communicate with external bodies over a significantly greater surface area than many existing diode designs, such as axial-leaded or wire-jumper based diode designs. Further, as FIG. 4 illustrates, die 186 defines a bottom die area 185 which is smaller than top surface area 191 and may be substantially electrically communicate with top surface area 191 over substantially all of its surface area when first diode 180 is in an assembled configuration. Because die 186 is able to electrically communicate with bottom die interface 190 over substantially all of its surface area, bottom die interface 190 may allow greater thermal and electrical conductivity between die 186 and external bodies than afforded in some traditional diode designs. In some examples, die 186 may be soldered to bottom die interface 190, though this is not specifically required.

As FIG. 4 illustrates, die 186 is configured to fit between top die interface 184 and bottom die interface 190 when in an assembled configuration. As FIG. 4 shows, die 186 defines a top die area projection 187 defining a glass ring surrounding a top die area 188. As FIG. 4 illustrates, die 186 also defines bottom die area 185 opposite top die area 188. Die 186 defines a glass-passivated Schottky diode die, with an anode proximate bottom die area 185 and a cathode proximate top die area 188. Because it is in electrical communication with bottom die area 185, bottom die interface 190 is able to conduct current and heat between die 186's anode and external bodies.

As FIG. 4 shows, top die interface 184 defines a substantially rectangular slug configured to fit within top die area projection 187. As FIG. 4 illustrates, top die interface 184 defines a bottom surface area 183 and a top surface area 181. As FIG. 4 shows, bottom surface area 183 fits within top die area projection 187 to be put in electrical communication with substantially all of top die area 188. In some examples, die 186 may be soldered to top die interface 184, but this is not specifically required. Likewise, as FIG. 4 shows, top surface area 181 is similar in size to top die area 188. Because top die interface 184 is electrically and thermally conductive, it able to conduct current between die 186's cathode and external circuits more effectively than similar connectors in some other traditional diode designs.

As FIG. 4 shows, silicone layer 182 fits around bottom die interface 190, die 186, and top die interface 184 to provide additional protection to these components. Silicone layer 182 may also provide stress protection for module 100 when first diode 180 is supported by lead frame 110.

By increasing the surface area with which external circuitry may connect to die 186's anode and cathode, first diode 180 is able to conduct current more effectively than some existing diode designs. For example, some traditional, axial-leaded designs are connected by two wire leads that are each soldered to a die. Other traditional diode examples, such as TO-220 packaged diodes, include jumper wires that connect the anode of the diode to external circuitry. In each of these designs, the wires' tiny cross-sectional areas compared to the corresponding dies' substantially reduces dies' useful area for conducting current flow and dissipating heat away from the dies. These design flaws, which disclosed modules overcome, may help contribute to catastrophic diode failures as a result of die overheating.

Second diode 192 and third diode 193 share a substantially similar design with first diode 180, and the reader should reference the discussion of first diode 180 above to reference the detail of their designs.

As FIG. 3 illustrates, lead frame 110 provides support to and electrically connects first diode 180, second diode 192, and third diode 193 with one another. Lead frame 110 additionally provides terminals that may be used to connect panel 50's circuitry, such as through panel leads, and external circuits, such as through system cables, to module 100's circuitry. As FIG. 8 shows, lead frame 110 includes a first outlet terminal 112, a second outlet terminal 126, a third outlet terminal 140, a fourth outlet terminal 154, a first lead 114, a second lead 128, a third lead 142, and a fourth lead 156.

Figure 8:
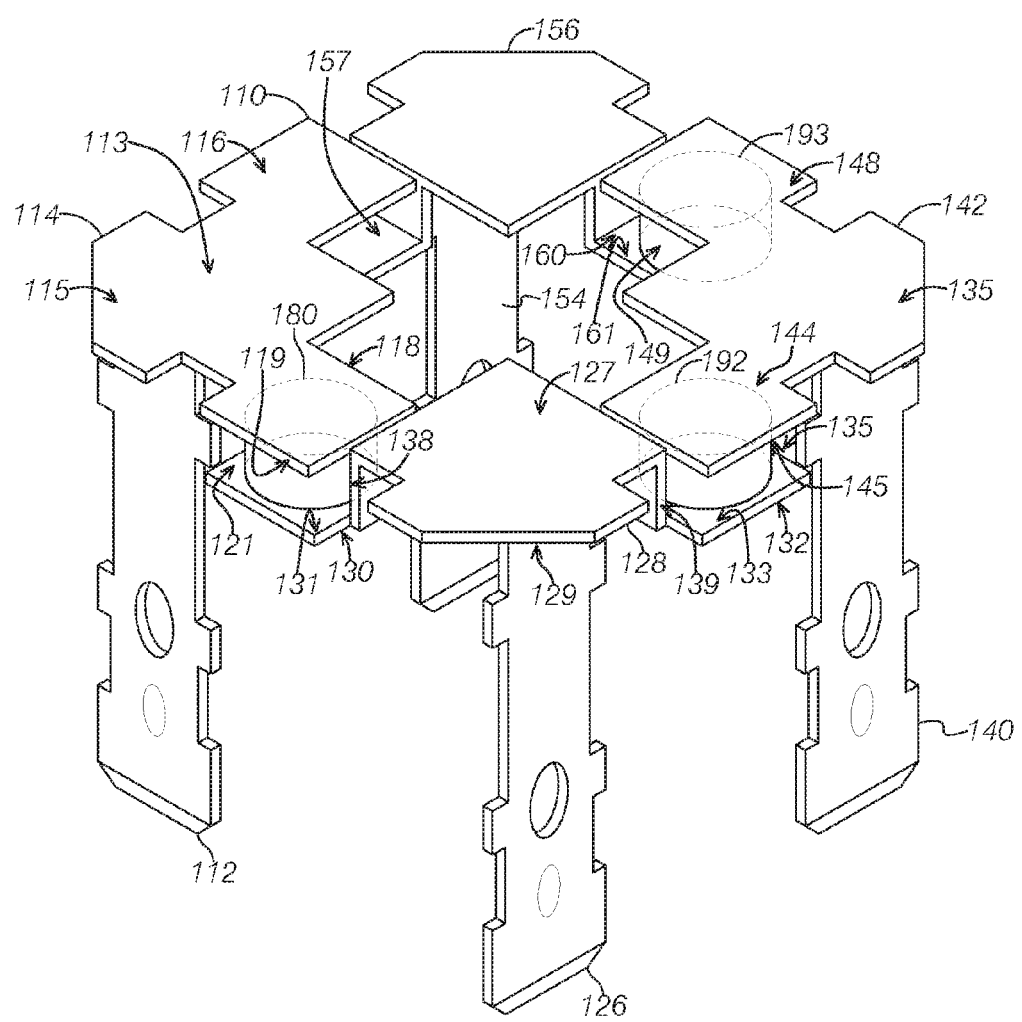
FIG. 8 is a perspective view of a lead frame included in the diode cell module shown in FIG. 1.

As FIG. 8 illustrates, first outlet terminal 112 defines a metallic, rigid, and electrically conductive body. First outlet terminal 112 extends from a first end within circuit space 172 to a second end outside of circuit space 172 when module 100 is assembled. As FIG. 6 shows, first outlet terminal 112 may be connected in electric communication with first system cable 77 via first external cable lead 85 to connect module 100 and panel 50 to external systems. As FIG. 6 illustrates, first outlet terminal 112 may further be connected in electrical communication with first panel lead 58. Although not specifically required in all examples, the diode cells, leads, and outlet terminals of lead frame 110 are connected with solder. In some examples, the solder used to connect lead frames may define a melting temperature that is lower than solder used to construct the diodes.

As FIG. 6 shows, a two-pronged clip 199i may be fitted on first outlet terminal 112 to connect first outlet terminal 112 to first external cable lead 85 and first panel lead 58. Two-pronged clip 199i is electrically conductive and is configured to slidingly receive first panel lead 58 and first external cable lead 85. Two-pronged clip 199i may define a double heads fast-on connector, but this is not specifically required.

Figure 7:
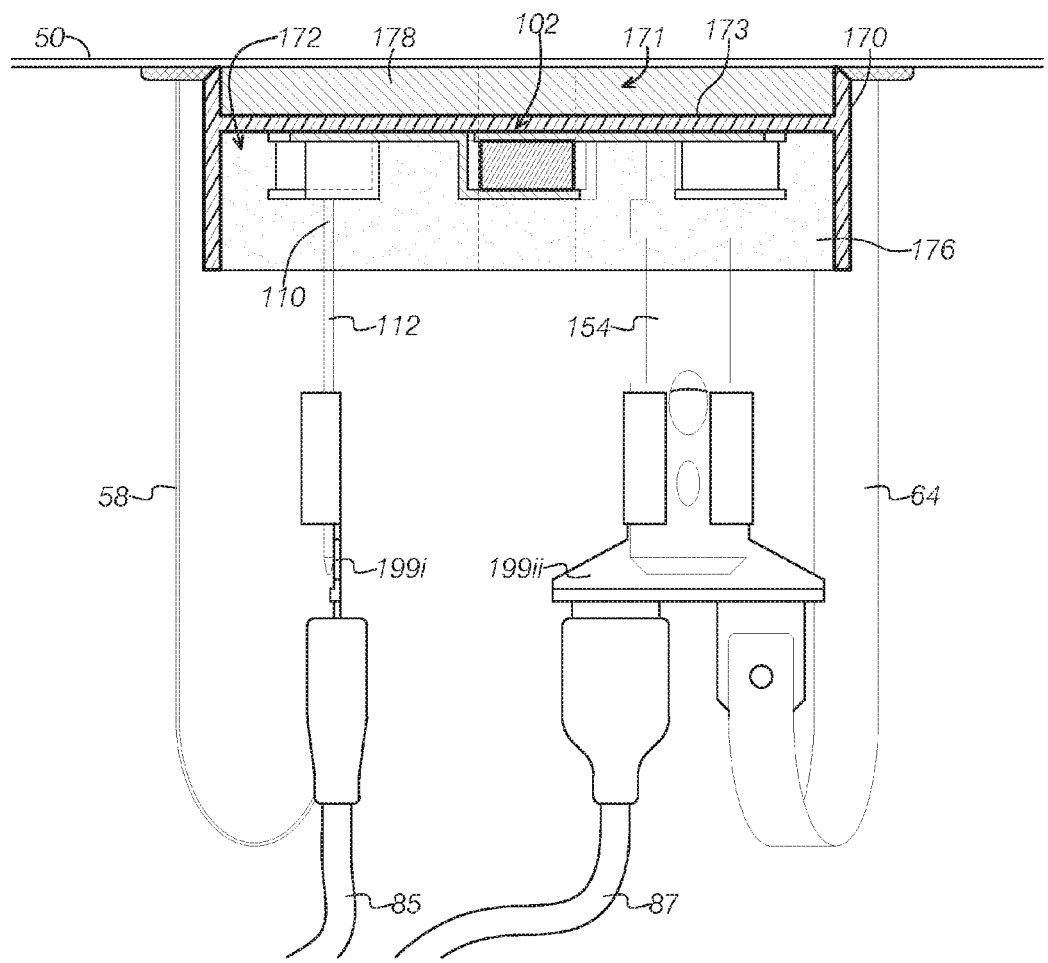
FIG. 7 is a cross sectional view taken about the line 7-7 showing the diode cell module shown in FIG. 1 engaged with a photovoltaic panel.

As FIG. 8 illustrates, first lead 114 defines a metallic, thermally and electrically conductive metallic body connected to first outlet terminal 112 in electric communication. As FIG. 7 shows, first lead 114 may be partially or wholly positioned within circuit space 172. As FIG. 8 shows, first lead 114 defines a base portion 115, a first diode portion 116, and a second diode portion 118. As FIG. 8 shows, first diode portion 116 extends toward fourth lead 156 from base portion 115 and second diode portion 118 extends from second lead 128 toward second lead 128, substantially transverse to first diode portion 116. As FIG. 8 illustrates, base portion 115 structurally allows first lead 114 to conform to encapsulation case 170's rectangular design.

As FIG. 8 illustrates, second diode portion 118 defines a diode surface 119 engaged with substantially all of top surface area 181 of first diode 180. As FIG. 8 illustrates, base portion 115, first diode portion 116, and second diode portion 118 all define surfaces on their top that are aligned with one another. Because these surfaces are aligned, they may be simultaneously substantially engaged with electrically insulating layer 173 when lead frame 110 is positioned partially within circuit space 172, such as seen in FIG. 7. This portion of first lead 114 that may be engaged with electrically insulating layer 173 defines a dissipation portion 113. Because first lead 114 is thermally conductive, first lead 114 is able to dissipate heat away from first diode 180 and direct it to pass through thermally conductive electrically insulating layer 173 and subsequently unload it onto thermal dissipating member 178. First lead 114's effectiveness in directing heat to electrically insulating layer 173 and thermal dissipating member 178 is greater the more proximate dissipation portion 113 is to electrically insulating layer 173. Dissipation portion 113 may be, but is not required to be, engaged with electrically insulating layer 173.

As FIG. 8 illustrates, lead frame 110 includes second lead 128, a metallic, electrically and thermally conductive body spaced from first lead 114. As FIG. 8 shows, second lead 128 defines a base portion 129, a first diode portion 130, a second diode portion 132, a first connecting portion 138, and a second connecting portion 139. As FIG. 8 illustrates, first diode portion 130 defines a first diode surface 131 vertically spaced from diode surface 119 to define a diode space 121 sized to fit first diode 180. First lead 114 and second lead 128 are configured to retain first diode 180 in diode space 121, with substantially all of top surface area 181 joined in electric communication with first diode surface 131 and all of bottom surface area 189 joined with diode surface 119. In some examples, solder or thermally and electrically conducting adhesive may be used to join first diode 180 with first lead 114 and second lead 128.

As FIG. 8 shows, diode surface 119 of first lead 114 and first diode surface 131 of second lead 128 may define surface areas substantially similar to or larger than that defined by the contact points of diodes placed in diode space 121. For example, diode surface 119 defines a larger surface area than bottom surface area 189, allowing bottom surface area 189 to be substantially fully engaged with diode surface 119.

As FIG. 8 shows, second lead 128 defines a base portion 129 that is vertically spaced from first diode portion 130. Accordingly, first connecting portion 138 extends at an angle to connect first diode portion 130 in electronic and thermal communication with base portion 129. The precise angle by which first connecting portion 138 extends from first diode portion 130 may be adjusted to maximize the size of base portion 129 (and thus, maximize the amount of surface area available to engage electrically insulating layer 173 and direct heat away from second lead 128). As FIG. 8 illustrates, first connecting portion 138 extends from first diode portion 130 at a 90 degree angle. In some examples, connecting portions may define a number of angles; in other examples, connecting portions may follow non-linear paths along their lengths. As FIG. 8 shows, base portion 129 is vertically positioned to engage with electrically insulating layer 173, additionally or alternatively to dissipation portion 113. As a result, base portion 129 may additionally or alternatively be included with lead frames' dissipating portions. Other base portions or other portions of additional or alternative leads may be aligned with first lead 114 and base portion 129 to additionally engage with electrically insulating layer 173. For example, third lead 142 is substantially aligned with first lead 114 and fourth lead 156 defines a base portion aligned with base portion 129.

As FIG. 8 shows, second diode portion 132 is connected to base portion 129 via second connecting portion 139, substantially similar to first diode portion 130's connection. As FIG. 8 illustrates, second diode portion 132 extends substantially transverse to first diode portion 130. As FIG. 8 shows, second diode portion 132 defines a second diode surface 133 configured to engage the bottom surface area of second diode 192's bottom slug or the top surface area of second diode 192's top slug.

As FIG. 8 shows, second outlet terminal 126 extends from second lead 128 inside circuit space 172 to a second end outside circuit space 172, substantially similar to first outlet terminal 112. As FIG. 8 shows, however, second outlet terminal 126 is longitudinally rotated 90 degrees compared to first outlet terminal 112. As FIG. 6 illustrates, second outlet terminal 126 may be connected in electric communication with second panel lead 60. As FIG. 6 further shows, a lead coupler 198*i* configured to slidingly receive second panel lead 60 may be attached to second outlet terminal 126. Lead coupler 198*i* may define a female fast-on terminal, but this is not specifically required.

As FIG. 8 illustrates, third lead 142 is a metallic, electrically and thermally conductive body spaced from second lead 128. Third lead 142 is substantially similar to first lead 114, albeit arranged in a mirrored configuration. As FIG. 8 shows, third lead 142 includes a first diode portion 144 defining a first diode surface 145, substantially similar to first diode portion 116. As FIG. 8 additionally shows, third lead 142 includes a second diode portion 148 defining a second diode surface 149.

As FIG. 8 shows, second diode surface 133 of second lead 128 and first diode surface 145 of third lead 142 are configured to retain second diode 192 in a second diode space 135, substantially similar to first diode 180 in diode space 121. Second diode 192 is joined with its bottom die interface's bottom surface area engaged with first diode surface 145 of third lead 142 and its top die interface's top surface area engaged with second diode surface 133 of second lead 128.

As FIG. 8 shows, third outlet terminal 140 extends from third lead 142 inside circuit space 172 to a second end outside circuit space 172, substantially similar to second outlet terminal 126. As FIG. 6 illustrates, third outlet terminal 140 may be connected in electric communication with third panel lead 62. As FIG. 6 further shows, a lead coupler 198*ii* configured to slidingly receive third panel lead 62 may be attached to third outlet terminal 140. Lead coupler 198*ii* may define a female fast-on terminal, but this is not specifically required.

As FIG. 8 illustrates, fourth lead 156 defines a metallic, electrically and thermally conductive body spaced from third lead 142. Fourth lead 156 is substantially similar to second lead 128, albeit arranged in a mirrored configuration. As FIG. 8 shows, fourth lead 156 includes a first diode portion 160 defining a first diode surface 161, substantially similar to first diode portion 130 of second lead 128 and a second diode portion 157 substantially similar to second diode portion 132 of second lead 128.

As FIG. 8 shows, second diode surface 133 of third lead 142 and first diode surface 145 of fourth lead 156 are configured to retain third diode 193 in a third diode space 149, substantially similar to first diode 180 in diode space 121. Third diode 193 is joined with its bottom slug's bottom surface area engaged with first diode surface 161 of fourth lead 156 and its top slug's top surface area engaged with second diode surface 149 of third lead 142.

As FIG. 8 illustrates, lead frame 110 does not support a circuit element (such as a diode) in the space between first diode portion 116 of first lead 114 and second diode portion 157 fourth lead 156. In some examples, however, circuit elements, such as an additional diode or integrated circuit, may be positioned therein.

As FIG. 1 shows, module 100 defines a bore 105 routed through encapsulation case 170 and contained elements. In some examples, a fastener, such as a screw, may be routed through the bore to retain module 100 engaged with external bodies. This may be useful, for example, to fasten module 100 to bodies capable of receiving heat dissipated from module 100, such as heat sinks, photovoltaic panel structures, and other thermally conductive bodies.

As FIG. 3 shows, encapsulation case 170 is substantially rectangular in shape. As FIG. 3 shows, encapsulation case 170 partially encloses a dissipating space 171 on a first longitudinal side of encapsulation case 170 and a circuit space 172 on a second longitudinal side of encapsulation case 170 opposite the first longitudinal side. As FIG. 3 illustrates, encapsulation case 170 defines an electrically insulating layer 173 between dissipating space 171 and circuit space 172. As FIG. 3 shows, encapsulation case 170 is configured to retain thermal dissipating member 178 and lead frame 110 positioned near one another.

As FIG. 3 shows, lead frame 110 may be positioned with one or more of the lead frame's leads' dissipation portions engaged with electrically insulating layer 173 when module 100 is assembled. Encapsulant 176 may be deposited in circuit space 172 around the contained portions of lead frame 110 to retain lead frame 110 proximate electrically insulating layer 173. In some examples, encapsulant 176 may be deposited around an encapsulated portion of a lead frame before permanently cured under elevated temperatures. For example, FIG. 3 illustrates encapsulant 176 with a removed section that illustrates where the encapsulated portion of lead frame 110 will be positioned when module 100 is assembled.

Encapsulant 176 may, in some examples, define a liquid and electric resistant thermosetting material. Additionally or alternatively, encapsulant 176 may define a molding epoxy (which may also have liquid and electric resistant properties). Using an epoxy, as some examples do, may provide benefits over some other encapsulant materials, such as silicon, are poor thermal conductors. While this disclosure considers that various examples that embody the inventive subject matter of this disclosure may include encapsulant including or defining silicon, this disclosure notes that examples with encapsulants that include epoxy may provide improved thermal conductivity characteristics compared to silicon encapsulant examples.

Electrically insulating layer 173 defines a thermally conductive, electrically insulating layer that extends across encapsulation case 170 cross-sectional area between circuit space 172 and dissipating space 171. Thermal dissipating member 178 defines an thermally conductive body made of alumina that substantially fills dissipating space 171.

As FIG. 7 illustrates, lead frame 110, electrically insulating layer 173, and thermal dissipating member 178 may each define layers of a thermally conductive path 102 that allows heat to dissipate from lead frame 110's circuitry. Thermally conductive path 102 may, for example, dissipate heat proximate a first end proximate one or more of first diode 180, second diode 192, and third diode 193, to a second end within the ambient space proximate thermal dissipating member 178. For example, lead frame 110 is thermally conductive, thereby allowing module 100's diodes to dissipate heat through lead frame 110. Lead frame 110's proximity to electrically insulating layer 173 allows lead frame 110 to dissipate heat to thermal dissipating member 178 while directing any electric current away from electrically insulating layer 173 and toward lead frame 110's outlet terminals. In some examples, encapsulant 176 may define an electrically insulating but thermally conductive material, such as epoxy, which may increase module 100's effectiveness in dissipating heat away from lead frame 110 and the diodes. In additional or alternative examples, encapsulant may define thermally insulating material that effectively directs a greater percentage of heat dissipated from lead frame 110 toward electrically insulating layer 173.

As FIG. 7 shows, thermally conductive path 102 may be engaged with external dissipating structures. For example, thermally conductive path 102 may be engaged with panel 50's structure by engaging thermal dissipating member 178 to thermally conductive portions of panel 50. This may be particularly useful, for example, when portions of panel 50 include a thermally conductive material, such as a metal. This disclosure notes the benefit engaging the thermally conductive path to dissipating structures that include a large amount of surface area exposed to ambient space, such as glass or metal. This may, for example, allow module 100 to use panel 50 as an external heat sink, allowing module 100 to dissipate heat generated by the first diode 180, second diode 192, and third diode 193 to the environment surrounding panel 50. In some examples, dissipating structures may include other examples external heat sinks, such as standalone heat sinks which may, in some examples, include a design including one or more projections designed to increase exposed surface area. For example, as FIG. 5 shows, panel 50 includes a metal rack 51 defining an opening 49. In some examples, module 100 may be fastened to metal rack 151 using a fastener routed through bore 105 and opening 49.

Figure 9:
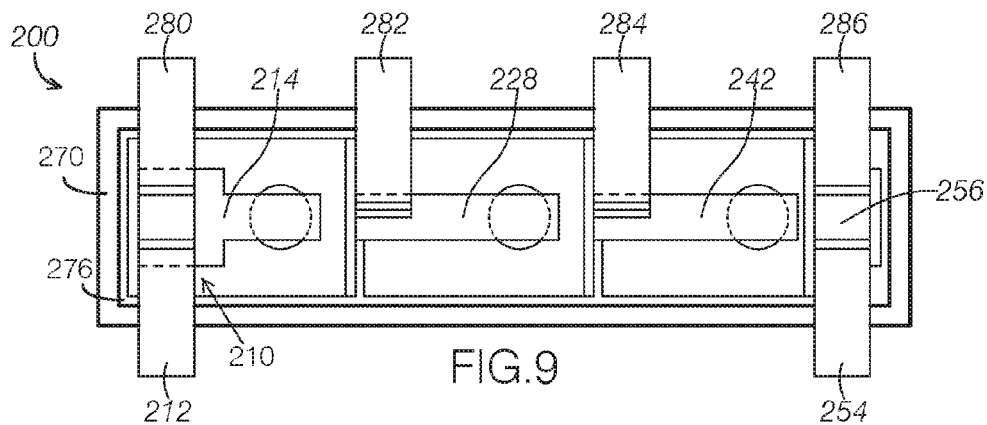
FIG. 9 is a bottom cutaway view of a second example of a diode cell module.

FIG. 9 illustrates a second example of a diode cell module, module 200. Module 200 includes many similar or identical features to module 100 combined in unique and distinct ways. Thus, for the sake of brevity, each feature of module 200 will not be redundantly explained. Rather, key distinctions between module 200 and module 100 will be described in detail and the reader should reference the discussion above for features substantially similar between the two diode cell modules.

As FIG. 9 illustrates, many of the features of embodied by module 100 are not limited to any particular shape or configuration. FIG. 9 illustrates a top view of a lead frame 210 supported within encapsulation case 270 with encapsulant 276, substantially similar to module 100's configuration. Like lead frame 110, module 200 includes linear lead frame 210 configured with four leads direct current through module 200, including first lead 214, second lead 228, third lead 242, and fourth lead 256. As FIG. 9 shows, linear lead frame 210's internal leads are configured to route current across three diodes, similar to lead frame 110.

FIG. 9 draws attention to differences between module 200 and module 100. FIG. 9 illustrates that lead frame 210 has a linear configuration and module 200's circuit physically forms a substantially linear path, differing from the rectangular path taken by lead frame 110. Each configuration is substantially the same electrically, however. Accordingly, module 200 illustrates that features disclosed herein are not necessarily limited to any particular shape.

Further, module 200, as shown in FIG. 9, a slightly different configuration for connecting to panel leads. As FIG. 9 shows, linear lead frame 210 includes a first system outlet terminal 212 extending from first lead 214 and second system outlet terminal 254 extending from fourth lead 256. As FIG. 9 additionally illustrates, linear lead frame 210 additionally includes four panel outlet terminals, first panel outlet terminal 280 extending from first lead 214 spaced from and extending substantially opposite to first outlet terminal 212, second panel outlet terminal 282 extending from second lead 228, third panel outlet terminal 284 extending from third lead 242, and fourth panel outlet terminal 286 extending from fourth lead 256 spaced from and extending substantially opposite to second outlet terminal 254. Each of these outlet terminals are configured to attach to system cables, whereas each panel outlet terminal is configured to connect to panel leads extending from an associated panel. As FIG. 9 shows, first outlet terminal 212 and second outlet terminal 254 are each attached to the internal circuitry separate from corresponding panel leads. This may simplify module 200 with an attached panel and connection within junction box. While many diode cell modules examples will include four outlet terminals, such as module 100, this disclosure equally contemplates having more or fewer outlet terminals, as the example shown in FIG. 9 illustrates.

Further, examples may have more or fewer diodes. For example, many configurations may have one or two diodes; this may be particularly useful in smaller photovoltaic generation facilities. In several such examples, outlet terminals will often be connected to the anodes and cathodes of each diode.

Figure 10:
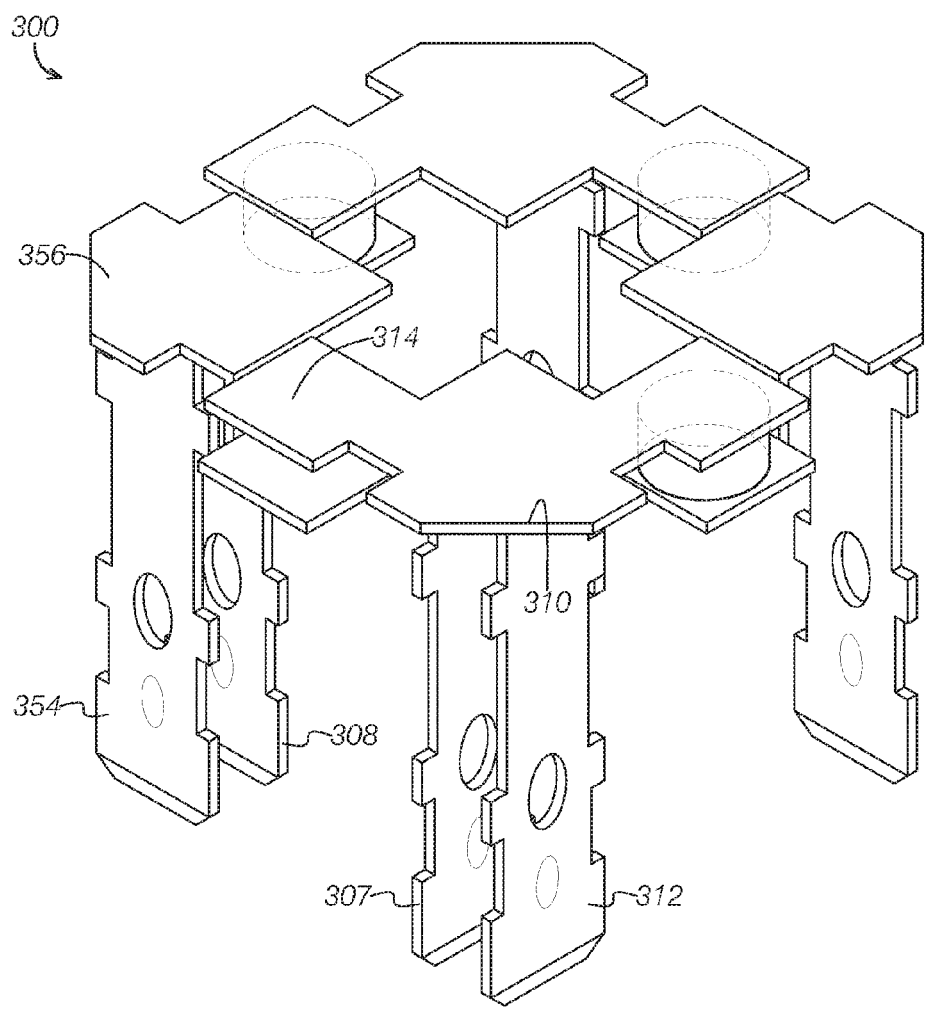
FIG. 10 is a perspective view of an example of a lead frame that may be used in various examples of diode cell modules described in this disclosure.

FIG. 10 illustrates an additional or alternative example of a lead frame, lead frame 310. Lead frame 310 includes many similar or identical features to lead frame 110 combined in unique and distinct ways. Thus, for the sake of brevity, each feature of lead frame 310 will not be redundantly explained. Rather, key distinctions between lead frame 310 and lead frame 110 will be described in detail and the reader should reference the discussion above for features substantially similar between the two lead frames.

As FIG. 10 shows, lead frame 310 is substantially similar to lead frame 110. As FIG. 10 shows, however, lead frame 310 includes two additional outlet terminals: first supplemental outlet terminal 307 connected to lead frame 310's first lead 314 and spaced from first outlet terminal 312 and second supplemental outlet terminal 308 connected to lead frame 310's fourth lead 356 and spaced from fourth outlet terminal 354. Lead frame 310's supplemental outlet terminals allow system cables and panel leads to be connected to lead frame 310's first and fourth leads without using the two-pronged clip 199i or other similar electrical splitting device. While electrically identical, this produces a cleaner design with fewer discrete parts. Accordingly, lead frame 310's design is less likely to malfunction during use than module 100.

The disclosure above encompasses multiple distinct inventions with independent utility. While each of these inventions has been disclosed in a particular form, the specific embodiments disclosed and illustrated above are not to be considered in a limiting sense as numerous variations are possible. The subject matter of the inventions includes all novel and non-obvious combinations and subcombinations of the various elements, features, functions and/or properties disclosed above and inherent to those skilled in the art pertaining to such inventions. Where the disclosure or subsequently filed claims recite "a" element, "a first" element, or any such equivalent term, the disclosure or claims should be understood to incorporate one or more such elements, neither requiring nor excluding two or more such elements.

Applicant(s) reserves the right to submit claims directed to combinations and subcombinations of the disclosed inventions that are believed to be novel and non-obvious. Inventions embodied in other combinations and subcombinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

The invention claimed is:

1. A diode cell module for use within photovoltaic systems including a photovoltaic panel, comprising:
   a electrically conductive lead frame including:
     a first outlet terminal;
     a first lead extending from the first outlet terminal, the first lead defining:
       a base portion of the first lead connected to the first outlet terminal; and
       a diode portion of the first lead extending from the base portion of the first lead transverse to the first outlet terminal;
     a second lead spaced from the first lead, the second lead defining:
       a base portion of the second lead;
       a first diode portion of the second lead extending from the base portion of the second lead substantially parallel to the diode portion of the first lead; and
       a second diode portion extending from the base portion of the second lead substantially transverse to the first diode portion of the second lead; and
     a third lead spaced from the second lead, the third lead defining:
       a base portion of the third lead; and
       a diode portion of the third lead extending from the base portion of the third lead substantially parallel to the second diode portion of the second lead;
     a second outlet terminal extending from the base portion of the second lead; and
     a third outlet terminal extending from the base portion of the third lead; and
   a first diode in electrical contact with the diode portion of the first lead and with the diode portion of the second lead and
   a second diode joined with the diode portion of the third lead and the second diode portion of the second lead.

2. The diode cell module of claim 1, wherein the photovoltaic panel includes:
   a first string of photovoltaic cells defining a positive terminal and a negative terminal;
   a second string of photovoltaic cells defining a positive terminal and a negative terminal;
   a first panel lead electrically connected to the positive terminal of the first string and the first outlet terminal;
   a second panel lead electrically connected to the negative terminal of the first string, the positive terminal of the second string, and the second outlet terminal; and
   a third panel lead electrically connected the negative terminal of the second string and the third outlet terminal.

3. The diode cell module of claim 1, wherein:
   the first diode includes:
     a die defining a bottom die area and a top die area projection surrounding a top die area;
     an electrically conductive top die interface substantially fitted within the top die area projection; and
     an electrically conductive bottom die interface engaged with substantially all of the bottom die area, the electrically conductive bottom die interface defining a bottom surface area distal the die; and
   wherein one of the diode portion of the first lead or the first diode portion of the second lead is joined with a majority of the bottom die interface's bottom surface area.

4. The diode cell module of claim 1, further comprising:
an encapsulation case, the encapsulation case enclosing a circuit space at least partially enclosing the first diode, the first lead, and the second lead; and
an encapsulant disposed in the circuit space, the encapsulant defining a liquid and electric-resistant thermosetting material molded around an encapsulated portion of the lead frame.

5. The diode cell module of claim 4, wherein the encapsulant is a molding epoxy.

6. The diode cell module of claim 4, wherein the encapsulation case defines:
an insulation layer abutting the circuit space; and
a dissipating space abutting the insulation layer distal the circuit space.

7. The diode cell module of claim 6, further comprising a thermally conductive thermal dissipating member disposed within the dissipating space.

8. The diode cell module of claim 1, wherein the first diode portion of the second lead includes:
a diode contact portion of the second lead spaced from the base portion of the second lead and in contact with the first diode; and
a connecting portion of the second lead extending from the diode contact portion of the second lead to the base portion of the second lead.

9. The diode cell module of claim 8, wherein the base portion of the second lead, the diode contact portion of the second lead, and the connecting portion of the second lead are arranged to cooperatively increase the surface area of the second lead.

10. The diode cell module of claim 9, wherein:
the diode contact portion of the second lead spaced from the base portion of the second lead; and
the connecting portion of the second lead extends vertically from the diode contact portion of the second lead to the base portion of the second lead.

11. The diode cell module of claim 1, further comprising a thermally conductive insulating layer in thermal communication with the lead frame.

12. The diode cell module of claim 11, wherein the thermally conductive insulating layer abuts the lead frame.

13. The diode cell module of claim 11, further comprising a thermal dissipating member in thermal communication with the thermally conductive insulating member to define a thermally conductive path from the lead frame to the thermal dissipating member.

14. The diode cell module of claim 13, wherein:
the base portion of the second lead abuts the thermally conductive insulating layer; and
the thermally conductive path extends to the first diode via the first diode portion of the second lead and the base portion of the second lead.

15. The diode cell module of claim 13, wherein the thermal dissipating member abuts the thermally conductive insulating member.

16. The diode cell module of claim 13 operatively supported by a photovoltaic panel, wherein the photovoltaic panel is in thermal communication with at least the thermal dissipating member and the thermally conductive path extends to the photovoltaic panel via the thermal dissipating member.

17. The diode cell module of claim 16, wherein the diode cell module is mechanically coupled to the photovoltaic panel.

18. The diode cell module of claim 13, wherein the thermal dissipating member is made of aluminum.

19. The diode cell module of claim 1, further comprising a fourth lead disposed between the first lead and the third lead.

20. The diode cell module of claim 18, wherein the first lead, the second lead, the third lead, and the fourth lead are arranged to collectively form a substantially square arrangement with each of the first lead, the second lead, the third lead, and the fourth lead defining a corner and two sides of the substantially square arrangement.

* * * * *